United States Patent
Iino et al.

(10) Patent No.: US 6,313,637 B1
(45) Date of Patent: Nov. 6, 2001

(54) VOLTAGE DETECTING DEVICE FOR SET BATTERY

(75) Inventors: Junichi Iino, Kariya; Masaya Itou, Toyota; Hidetoshi Kato, Suzuka; Takashi Yamashita, Kariya; Tetsuya Kobayashi, Anjo, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/195,555

(22) Filed: Nov. 19, 1998

(30) Foreign Application Priority Data

Nov. 20, 1997 (JP) .................................. 9-319792
Nov. 26, 1997 (JP) .................................. 9-324529
Nov. 28, 1997 (JP) .................................. 9-327399

(51) Int. Cl.$^7$ ................................ G01N 27/416
(52) U.S. Cl. ........................................ 324/434
(58) Field of Search .................... 324/434, 430, 324/431, 432, 433

(56) References Cited

U.S. PATENT DOCUMENTS

| | | | |
|---|---|---|---|
| 5,387,857 | 2/1995 | Honda et al. | |
| 5,646,534 | * 7/1997 | Kopera | 324/434 |
| 5,710,503 | * 1/1998 | Sideris | 324/431 |
| 5,808,469 | * 9/1998 | Kopera | 324/434 |
| 5,945,829 | * 8/1999 | Bertness | 324/430 |

FOREIGN PATENT DOCUMENTS 8-140204   5/1996   (JP) .

* cited by examiner

*Primary Examiner*—Safet Metjahic
*Assistant Examiner*—J Kerveros
(74) *Attorney, Agent, or Firm*—Pillsbury Winthrop LLP (57) ABSTRACT

A set battery which generates a high voltage comprises a number of battery modules connected to each other in series. A module voltage of each of the battery modules is detected by a corresponding differential voltage detecting circuit and is transmitted to an A/D convertor. Each of Several voltage detecting blocks is constituted by a plurality of the differential voltage detecting circuits for detecting module voltages of a plurality of the battery modules contiguous to each other. Each of the differential voltage detecting circuits belonging to the same voltage detecting block is applied with a common reference potential which is used to detect the module voltage. The reference potential is set to values which differ from each other for the respective voltage detecting blocks.

25 Claims, 6 Drawing Sheets

VOLTAGE DETECTING DEVICE FOR SET BATTERY

CROSS REFERENCE TO RELATED APPLICATION

This application is based upon and claims the benefit of priority of Japanese Patent Applications No. H.9-319792 filed Nov. 20, 1997, No. H.9-324529 filed Nov. 26, 1997, and No. H.9-327399 filed Nov. 28, 1997, the contents of which are incorporated herein by reference.

BACKGROUND OF THE INVENTION

1. Field of the Invention

The present invention relates to a voltage detecting device for a set battery.

2. Description of Related Art

Detection of a remaining capacity of a set battery mounted on an electric vehicle or the like is generally carried out based on an open-terminal voltage estimated from total voltage and current thereof. Further, in a set battery of an electric vehicle, several hundreds of cell batteries are connected in series to generate high voltage. As a result, loss of wiring resistance is normally reduced. It is required that a voltage detecting device detects with high accuracy a total voltage of the set battery in which a number of battery cells are connected in series for generating electric power for an electric vehicle running while achieving reduction in power consumption and simplification in circuit constitution. However, meeting such a requirement is not easy. For example, assuming that voltage detection accuracy of a voltage detecting circuit is 0.1%, error of 0.3 V is caused when a total voltage of a set battery is 300 V. Meanwhile, a terminal voltage of a battery cell is about 1.2 V and accordingly, it is difficult to check failure of each battery cell and/or charging state by the total voltage.

Further, the detected total voltage is normally A/D (Analog to Digital)—converted for signal processing in a microcomputer. However, if the resolution of an A/D convertor is 11 bits, a resolution error of about 0.15 V is caused. Accordingly, an expensive and highly accurate A/D convertor is obliged to adopt, and necessary detection accuracy is not achieved with an inexpensive A/D convertor having a low resolution. Further, a semiconductor device having a high withstand voltage is needed to detect the high total voltage and accordingly, expense therefor must be disbursed.

According to a charging apparatus for a set battery disclosed in Japanese Unexamined Patent Publication No. JP-A-5-64377, module voltages of a plurality of modules (each module is constituted at least by one cell battery) constituting a set battery in which a number of cell batteries are connected in series, are individually detected. Charge control of the set battery is carried out with respect to the respective modules based on the detected module voltages.

Figure 5:
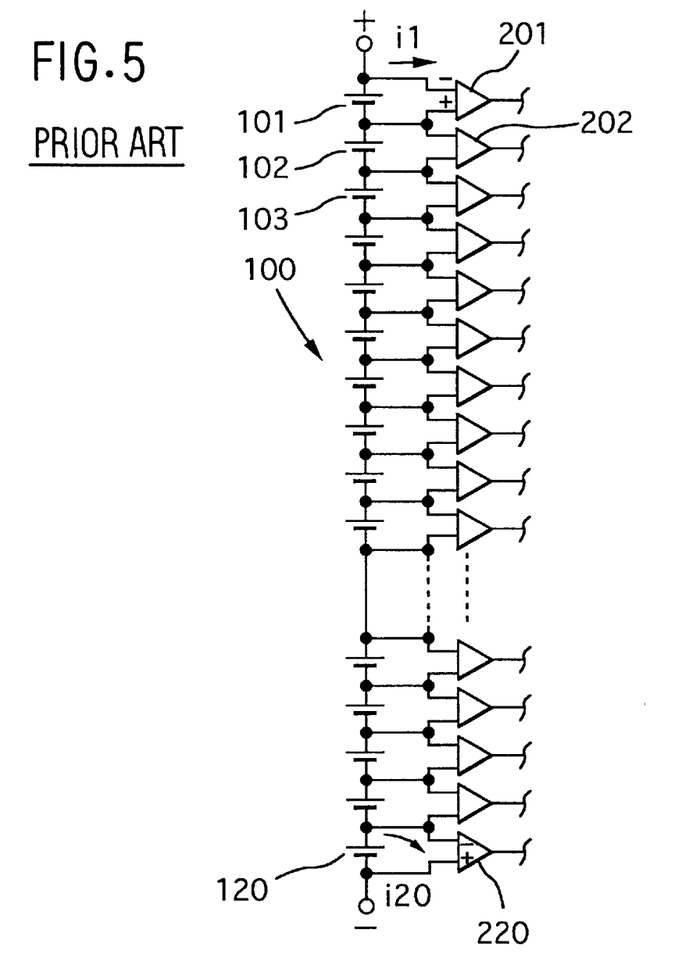
FIG. 5 is a block diagram showing a conventional voltage detecting device for a set battery.

That is, as shown in FIG. 5, a set battery is divided into a plurality of battery modules 101 through 120 and module voltages are detected by voltage detecting circuits 201 through 220, respectively. By summing up these module voltages, a total voltage of the set battery is calculated and a charge state of each of the battery modules is grasped.

However, when a differential-type voltage detecting circuit is used as a voltage detecting circuit for detecting each of the module voltages, there arise problems explained below.

Each of the differential-type voltage detecting circuits 201 through 220 includes an operational amplifier, an input side resistor circuit for setting both input terminals' potential (imaginal ground potential) and a feedback resistor. A lower potential terminal of the input side resistor circuit is connected to a lower potential side power source terminal and thereby the imaginal ground potential is set to a predetermined reference potential. Thereby, currents (hereinafter, referred to as input signal currents) flowing into or flowing out of signal input terminals of each differential voltage detecting circuit 201 through 220 can be considered to flow into the lower potential side power source terminal via the input side resistor circuit.

The battery modules 101 through 120 supplies current to the differential voltage detecting circuits 201 through 220, respectively, for detecting the respective module voltages.

Conventionally, the input terminal imaginal ground potentials of the operational amplifiers are uniformly set to a potential at the low potential side power source terminal of the set battery 100. Accordingly, the magnitude of the respective input signal current charged by each battery module in the battery modules 101 through 120 significantly differs. As a result, a voltage detection error and a dispersion in battery consumption are caused.

A further detailed explanation will be given in reference to FIG. 5 as follows.

Input signal current is fed from a high potential terminal of the battery module 101 to a negative input terminal of the differential voltage detecting circuit 201. The current flows to the low potential side power source terminal of the set battery 100 via the input side resistor circuits. After all, current is fed from all of the battery modules 101 through 120 to the negative input terminal of the differential voltage detecting circuit 201. Further, the same goes with a positive input terminal of the differential voltage detecting circuit 201.

The input signal current is fed from a high potential terminal of the battery module 102 to a negative input terminal of the successive differential voltage detecting circuit 202. The current flows to the low potential side power source terminal of the set voltage 100 via the input side resistor circuits. After all, current is fed from all the battery modules 102 through 120 excluding the battery module 101 in the respective battery modules 101 through 120 to the negative input terminal of the differential voltage detecting circuit 202.

Current is fed similarly in the successive differential voltage detecting circuits. Input signal current is fed from a high potential terminal of the battery module 120 to a negative input terminal of the differential voltage detecting circuit 220. The current flows to the low potential side power source terminal of the set battery 100 via the input side resistor circuit of the differential voltage detecting circuit 220. After all, current is fed only from the battery module 120 to the negative input terminal of the differential voltage detecting circuit 220.

As a result, it is known that the battery module 101 at the highest potential feeds the input signal current only to the differential voltage detecting circuit 201 and the battery module 120 at the lowest potential supplies the input signal current to all of the respective differential voltage detecting circuits 201 through 220.

Products of the input signal currents and internal resistances of the respective battery modules constitute internal voltage drops of the battery modules, respectively, which lower the module voltages of the battery modules 101 through 120. In this case, by the operation as mentioned above, some of the battery modules (for example, the battery module 120 or battery modules at a vicinity thereof) supply the input signal currents to a number of the differential voltage detecting circuits. Therefore, the lowering of the module voltage becomes significant and power consumption thereof is also increased.

Further, high voltage is applied on the input side resistor circuit of the differential voltage detecting circuit on a higher potential side and therefore, power consumption thereof is increased. When the resistance value of the input side resistor circuit is set high to restrain the power consumption, thermal resistance noise is increased and the frequency characteristic is deteriorated.

Further, in the conventional device, high withstand voltage needs to be assured in respect to resistors of the input side resistor circuits of the differential voltage detecting circuits on the higher potential side.

SUMMARY OF THE INVENTION

The present invention has been made in view of the above-described problems and it is an object of the present invention to provide a voltage detecting device for a set battery which can realize a reduction in input signal current charged by each of battery modules for detecting module voltages by differential voltage detecting circuits and detection of a set battery voltage with high accuracy while achieving low withstand voltage of respective elements in the differential voltage detecting circuits.

According to a voltage detecting device for a set battery of the present invention, a set battery which generates a high voltage is divided into a number of battery modules connected to each other in series. A module voltage of each of the divided battery modules is detected by a corresponding differential voltage detecting circuit and is transmitted to an A/D convertor.

Particularly, a voltage detecting block is constituted by a plurality of the differential voltage detecting circuits for detecting module voltages of a plurality of the battery modules contiguous to each other.

Further, one terminal of an input side resistor circuit of each of the differential voltage detecting circuits in the same voltage detecting block, is applied with a common reference potential and the reference potential is set to values which differ from each other for the respective voltage detecting blocks.

In this way, there can be achieved a reduction in input signal current used for the respective differential voltage detecting circuits detecting module voltages, which is supplied by the respective battery modules. Therefore, power consumption in the battery modules as well as dispersion of power consumption among the battery modules can be reduced. Also, respective elements in the differential voltage detecting circuit are allowed to have low withstand voltage and the battery voltage can be detected with high accuracy. Further, there is achieved an advantage that inexpensive mass-produced articles having no high accuracy can be used for the differential voltage detecting circuit and the A/D convertor.

In the voltage detecting device for a set battery as mentioned above, an input switching circuit may be further provided for sequentially inputting output voltages of all the differential voltage detecting circuits having a common reference potential in the same voltage detecting block, to the same A/D convertor. Thereby, a single A/D convertor can commonly be used in respect of the differential voltage detecting circuits in the same voltage detecting block. That is, since the reference potentials of the respective differential voltage detecting circuits are equal to each other, it is easy to commonly use a single A/D convertor for the differential voltage detecting circuits in the same voltage detecting block.

It is preferable for an output signal of the A/D convertor to be fed to a digital signal processing circuit driven with a predetermined low power source voltage via a photo coupler. Although plural A/D convertors are provided with high DC (Direct Current) potential levels different from each other, by adopting the photo couplers, an input DC level of the digital signal processing circuit (normally, CPU (Central Processing Unit)) at a later stage can be lowered and uniformed.

It is preferable that the voltage detecting block is constituted by three or more of the differential voltage detecting circuits respectively detecting module voltages of three or more of the battery modules contiguous to each other. In this case, the reference potential is set to an intermediary potential which is lower than the highest potential and higher than the lowest potential of three or more of the battery modules contiguous to each other.

In this way, a further reduction in input consumption current among the respective battery modules can be realized, and an unbalance among the input consumption currents can be cancelled.

The reference potential can be set to a potential closest to the intermediary potential among terminal voltages of the respective battery modules in the same voltage detecting block. In this way, a reference potential generating circuit can be omitted and the circuit constitution can be simplified.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

A detailed explanation will be given of embodiments as follows. However, the present invention is not limited to the embodiments mentioned below but can naturally be modified without departing from the spirit and the scope as set out in the accompanying claims.

(First Embodiment)

Figure 1:
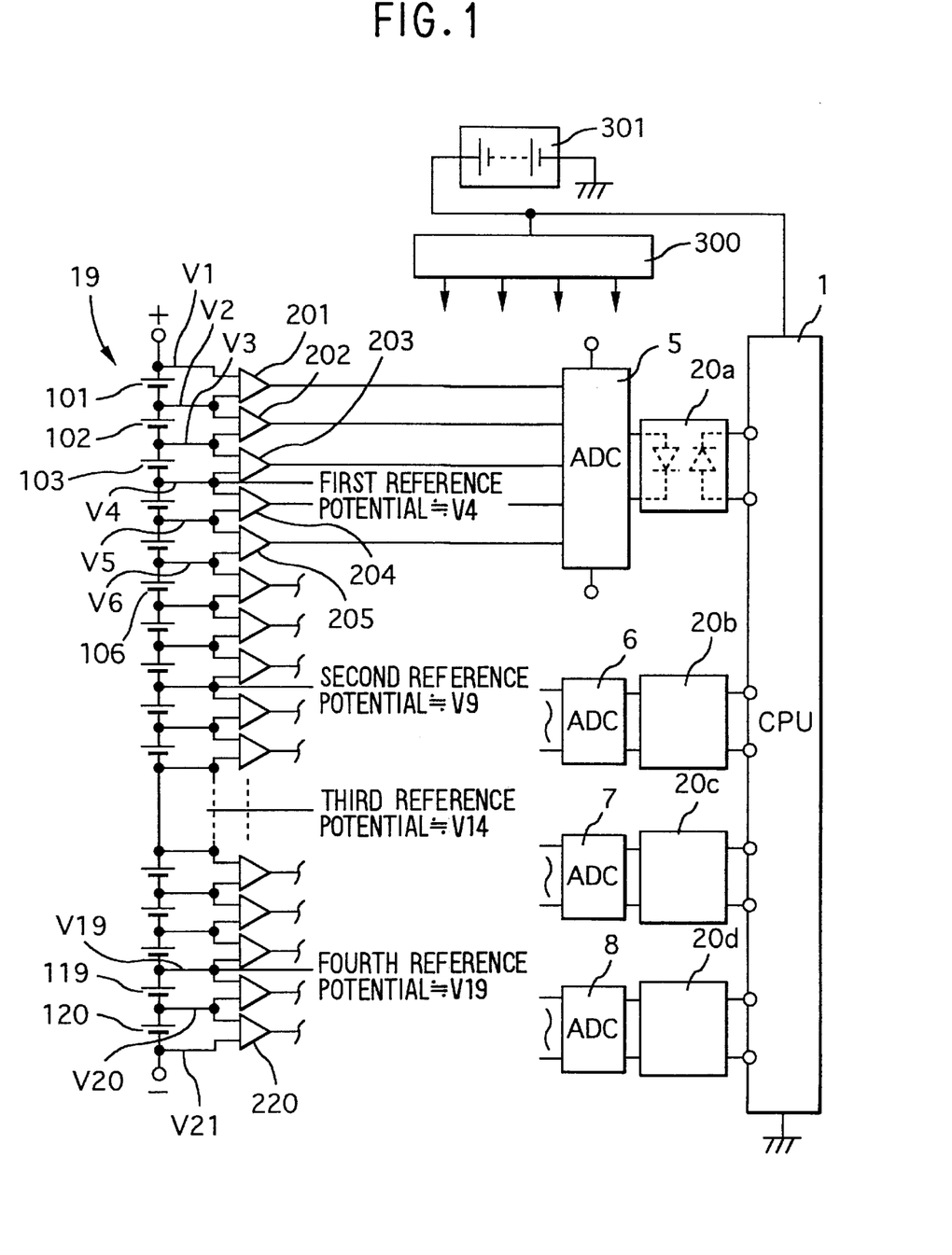
FIG. 1 is a block diagram showing a voltage detecting device for a set battery which converts each of module voltages in the set battery to a digital signal.

An explanation will be given of a voltage detecting device for a set battery according to a first embodiment of the present invention in reference to FIGS. 1 and 2. FIG. 1 is a block diagram showing a voltage detecting device for a set battery which feeds electric power to a motor of an electric vehicle. The voltage detecting device is mainly constituted by differential voltage detecting circuits 201 through 220, A/D convertors 5 through 8, photo couplers 20a through 20d and a CPU 1. Further, in FIG. 1, numeral 301 designates an auxiliary battery which feeds electric power to auxiliary machinery and the CPU 1 in the electric vehicle, and numeral 300 designates a power source voltage generating circuit (input-output insulation type DC-DC convertor) which converts a direct current voltage of the auxiliary battery 301 into a different level direct current voltage necessary for operation of the differential voltage detecting circuits 201 through 220 and the A/D convertors 5 through 10.

Figure 2:
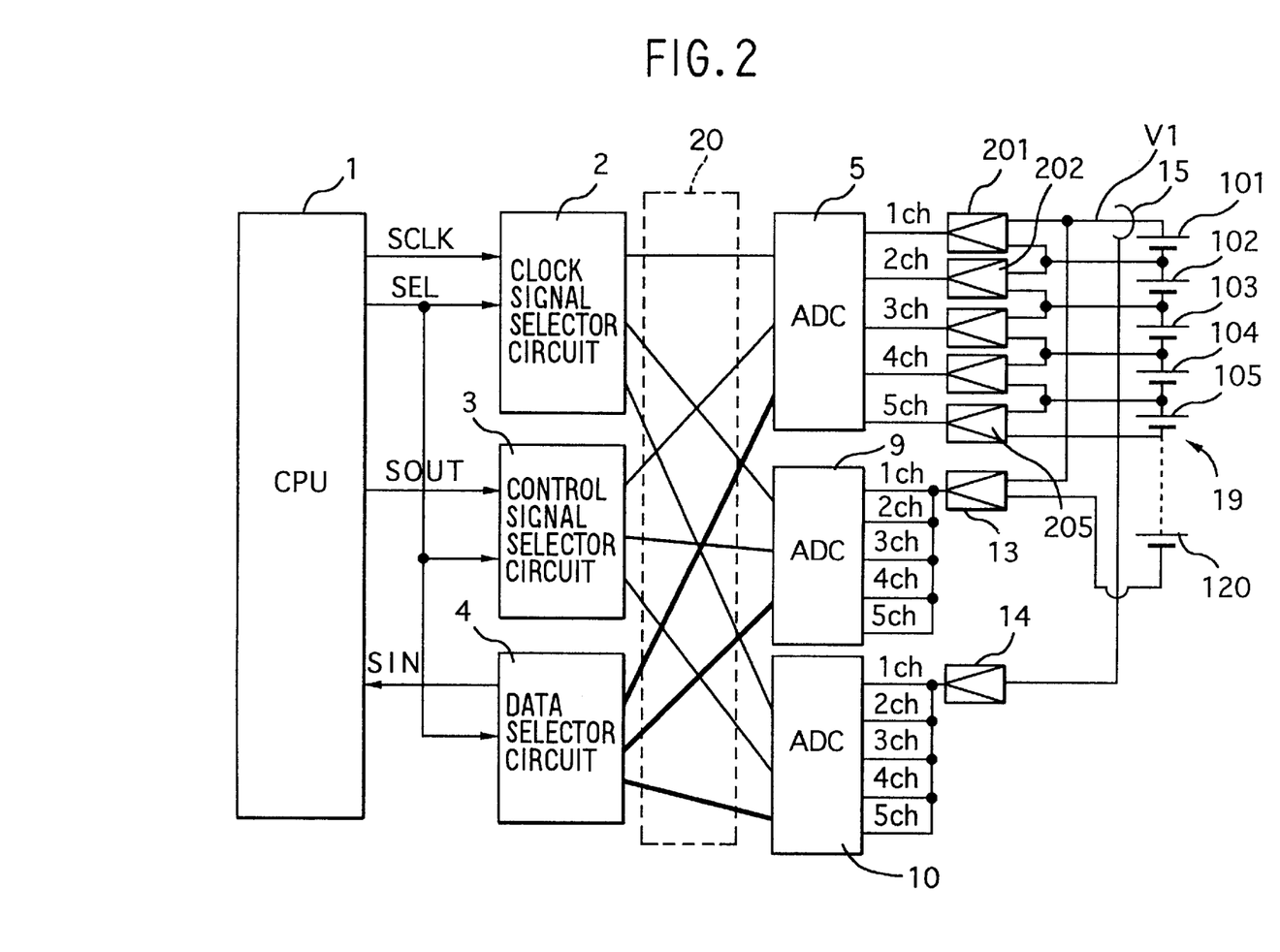
FIG. 2 is a block circuit diagram showing a detailed constitution of the voltage detecting device for a set battery in FIG. 1.

FIG. 2 is a block diagram showing a detailed constitution of the voltage detecting device in FIG. 1.

In FIG. 2, numeral 1 designates a CPU for controlling charging and discharging of batteries, numeral 2 designates a selector circuit comprising a multiplexor for distributing a clock signal (hereinafter, referred to as clock signal selector circuit), numeral 3 designates a selector circuit comprising a multiplexor for distributing a control signal (hereinafter, referred to as control signal selector circuit), numeral 4 designates a selector circuit comprising a multiplexor for selecting digital signals (hereinafter, referred to as data selector circuit). Further, numerals 5 through 10 designate A/D convertors, numerals 201 through 220 and 13 designate differential voltage detecting circuits, numeral 14 designates an analog amplifying circuit, numeral 15 designates a current sensor and numerals 101 through 120 designate respective battery modules (also simply referred to as modules) of a set battery 19. However, in FIG. 2, illustration of the battery modules 106 through 119, the differential voltage detecting circuits 206 through 220, and the A/D convertors 6 through 8 are omitted.

Each of the modules 101 through 120 is constituted by connecting twelve cell batteries in series. The module 101 has a module voltage of the highest potential and the module 120 has a module voltage of the lowest potential. Numeral 20 designates a group of serial signal lines for connecting the respective selector circuits 2 through 4 with the respective A/D convertors 5 through 10. In the first embodiment, signals from the respective A/D convertors 5 through 10 are inputted to the CPU 1 via the photo couplers 20a through 20d to protect the CPU 1. The A/D convertors 5 through 10 are input switching type A/D convertors each having five channel inputs. The channels of the respective A/D convertors 5 through 10 are synchronously switched by switch control signals fed from the CPU 1.

As shown in FIG. 1, the module voltage of the module 101 is A/D-converted by the A/D convertor 5 after having been changed into a voltage signal relative to a first predetermined reference potential by the differential voltage detecting circuit 201. Similarly, the module voltage of each of the modules 102 through 105 is A/D-converted by the A/D convertor 5 after having been changed into a voltage signal relative to the first predetermined reference potential by each of the differential detecting circuits 202 through 205.

Similarly, module voltages of the modules 106 through 120 are inputted to the A/D convertors 6 through 8 via the differential voltage detecting circuits 206 through 220, respectively.

A total voltage of the set voltage 19 is A/D-converted by the A/D convertor 9 after having been changed into a voltage signal relative to a predetermined common ground potential by the differential voltage detecting circuit 13. Current of the set battery 19 is A/D-converted by the A/D convertor 10 after having been amplified by the amplifying circuit 14.

Outputs of the respective A/D convertors 5 through 10 are sequentially selected by the data selector circuit 4 and are read in by the CPU 1 as signals SIN.

The A/D convertors 5 through 10 are of a synchronously-operating serial-output type and converted data, that is, serial digital signals are outputted in synchronism with clock pulses which are inputted after the digital signals are established therein.

Explaining further, the A/D convertor 5 is provided with an analog input terminal to which an analog signal is inputted, a data output terminal from which a digital signal being a serial signal is outputted, a control command input terminal to which a control command being a serial signal is inputted, and a clock pulse input terminal to which clock pulses for synchronization are inputted. When a read instruction is inputted to the control command input terminal, an analog signal to be A/D-converted is read. Thereafter, a serial digital signal of 8 bits is outputted responsive to an input of a succeeding clock pulse. The other A/D convertors 6 through 10 are also structured in the same manner.

An explanation will be given of further detailed operation of the voltage detecting device for the set battery.

The CPU 1 outputs clock pulses SCLK and an A/D convertor selecting signal SEL to the clock signal selector circuit 2, outputs a control command signal SOUT such as a read instruction or the like and the A/D convertor selecting signal SEL to the control signal selector circuit 3, outputs the A/D convertor selecting signal SEL to the data selector circuit 4 and receives the serial digital signals from the data selector circuit 4.

The CPU 1 informs the clock signal selector circuit 2 and the control signal selector circuit 3 that all of the A/D convertors 5 through 10 are selected by the A/D convertor selecting signal SEL. Thereby, the control signal selector circuit 3 transmits the read instruction to all of the A/D convertors 5 through 10, and the clock signal selector circuit 2 transmits the clock pulses SCLK to all of the A/D convertors 5 through 10. The respective AID convertors 5 through 10 read analog signals immediately after the read instructions are inputted, convert the analog signals into digital signals of 8 bits and hold them. At this occasion, in respect of the data selector circuit 4, the A/D convertor selecting signal SEL for selecting all of the A/D convertors 5 through 10 are made ineffective at inside of the data selector circuit 4.

Next, the CPU 1 informs the selector circuits 2 through 4 that the A/D convertor 5 is selected by the A/D convertor selecting signal SEL. Thereby, the clock signal selector circuit 2 transmits the clock pulses SCLK only to the A/D convertor 5. The A/D convertor 5 outputs a serial digital signal to the data selector circuit 4 in synchronism with edges of the clock pulses SCLK. The digital selector circuit 4 selects the A/D convertor 5 responsive to the A/D convertor circuit selecting signal SEL and therefore, the serial digital signal from the A/D convertor 5 is transmitted to the CPU 1.

Next, the CPU 1 informs the selector circuits 2 through 4 that the A/D convertor 6 is selected by the A/D convertor selecting signal SEL. Thereafter, a serial digital signal of the A/D convertor 6 is transmitted to the CPU 1 by the same operation as the above-described. The same operation is also carried out successively and serial digital signals of the respective A/D convertors 7 through 10 are transmitted to the CPU 1.

It is to be noted that, although the above-described series of operation is carried out in respect of the first input channels of the multiple input A/D convertors 5 through 10, thereafter, the series of operation is also carried out in respect of the second through the fifth input channels of the respective A/D convertors 5 through 10.

Next, an explanation will be given of the differential voltage detecting circuits 201 through 220 for detecting the module voltages in the set battery 19.

In the first embodiment, 240 of cell batteries in total constituting the set battery 19 are divided into 20 of the battery modules 101 through 120. In respect of the battery modules 101 through 120 which are divided in this way, the battery modules 101 through 105 constitute a first voltage detecting block, the battery modules 106 through 110 constitute a second voltage detecting block, the battery modules 111 through 115 constitute a third voltage detecting block and the battery modules 116 through 120 constitute a fourth voltage detecting block.

The first voltage detecting block is provided with the first reference potential, the second voltage detecting block is provided with a second reference potential, the third voltage detecting block is provided with a third reference potential and the fourth voltage detecting block is provided with a fourth reference potential.

According to the first embodiment, the first reference potential is set to a low potential side terminal voltage of the battery module 103 (high potential side terminal voltage of battery module 104). Similarly, each of the second to fourth reference potentials is set to a low potential side terminal voltage of a third battery module of each voltage detecting block from high potential side (high potential side terminal voltage of a second battery module from low potential side).

That is, according to the first embodiment, the reference potentials of the respective differential voltage detecting circuits (constant potential applied on one terminal of each input side resistor circuit) in the same voltage detecting block are equalized and the respective voltage detecting blocks are applied with the first through fourth reference potentials which are different from each other, respectively. Further, each of the first through fourth reference potentials is set to an intermediary potential of the battery modules in the respective voltage detecting blocks (a value as proximate as possible to an intermediary value between the highest terminal voltage and the lowest terminal voltage). Terminal voltages of the battery modules are used as the respective first through fourth reference potentials.

Therefore, according to the first embodiment, the following operation and effect can be achieved.

First, the total voltage of the set battery 19 can be calculated by a sum of the modules voltages V1 through V20 of the respective battery modules 101 through 120. Accordingly, although the numbers of the differential voltage detecting circuits 201 through 220 and the A/D convertors 5 through 8 are increased, accuracy and resolution necessitated to these can be lowered. Therefore, high accuracy can be achieved in detecting the total voltage by using inexpensive parts and influence of noise can also be reduced.

Next, according to the first embodiment, the respective voltage detecting blocks are provided with the different reference potentials. Input consumption currents fed to the respective differential voltage detecting circuits 201 through 220 are determined based on the reference potentials, respectively. Therefore, power consumption of the differential voltage detecting circuits is reduced. Further, input consumption current fed to the differential voltage detecting circuits by the battery module 120 having the lowest potential in the set battery is prevented from becoming extremely larger than input consumption current fed to the differential voltage detecting circuit by the battery module 101 having the highest potential in the set battery, unlike the conventional device. Therefore, degrees of dissipation of batteries are prevented from differing from each other and a measurement value of the module voltage is prevented from including error by the internal voltage drop owing thereto.

Further, because it is sufficient for resistors in the input side resistor circuits of the differential voltage detecting circuit to have low withstand voltages, fabrication of the circuits is facilitated.

Figure 3:
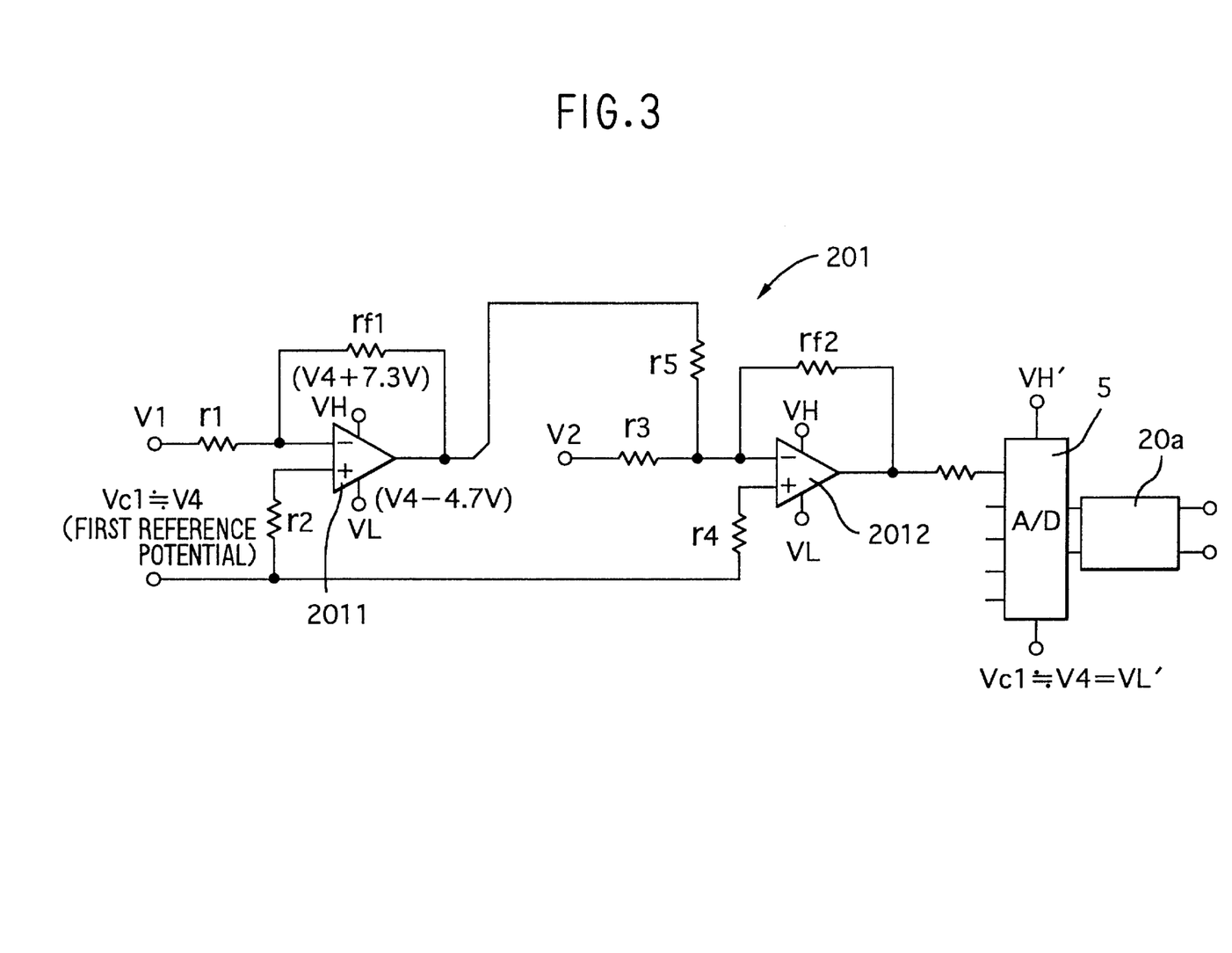
FIG. 3 is a block circuit diagram of a differential voltage detecting circuit 201 and an A/D convertor 5 in FIG. 1.

FIG. 3 shows a circuit diagram of the differential voltage detecting circuit 201.

Numeral 2011 designates an operational amplifier having an input resistor $r1$ and a feedback resistor $rf1$ for detecting a difference (v4–V1) between a terminal voltage V1 on the high potential side of the module 101 and the first reference potential V4 (in this case, it is set to a low potential side terminal voltage of the module 103 or high potential side terminal voltage of the module 104).

Similarly, numeral 2012 designates an operational amplifier having input resistors $r3$ and $r5$ and a feedback resistor $rf2$ for detecting a difference (V1–V2) by subtracting a sum of a terminal voltage V2 on the low potential side of the module 101 and the detected difference (V4–V1) from the first reference potential V4.

In respect of positive and negative power source voltages of the operational amplifiers 2011 and 2012, since potentials at positive and negative input terminals of the operational amplifiers are substantially equal to an imaginal ground potential, that is, the first reference potential V4, a positive power source voltage VH is set to be higher than the first reference potential V4 by a predetermined voltage (in this case, 7.3 V) and a negative power source voltage VL is set to be lower than the first reference potential V4 by a predetermined voltage (in this case, 4.7 V).

It is to be noted that, it is sufficient for the first reference potential V4 to be an intermediary potential between the highest potential V1 and the lowest potential V6 of the voltage detecting block, and the first reference potential V4 may be formed by using a specialized voltage generating circuit.

An explanation will be given of other features of the circuit device according to the first embodiment.

First, in the same voltage detecting block, output voltages from all of the differential voltage detecting circuits having the same reference potential are sequentially inputted to a single A/D convertor of an input switching type. Accordingly, although voltages of the respective battery modules to be detected are significantly different from each other, considerable simplification of circuit constitution can be realized due to common use of the A/D convertor.

Further, an output signal from each of the A/D convertors is outputted to the CPU 1 driven with a predetermined low power source voltage via the photo coupler 20a. Thereby, not only DC (Direct Current) voltage level differences among output signal voltages of the respective A/D convertors each having different power source voltage in conformity with the operational voltage of the voltage detecting block at a former stage is resolved, but also signals from the A/D convertors can be processed in digital by a single digital signal processing circuit (normally, CPU) operated with a low voltage as a result that high voltage is cut off by the photo coupler 20a.

Figure 4:
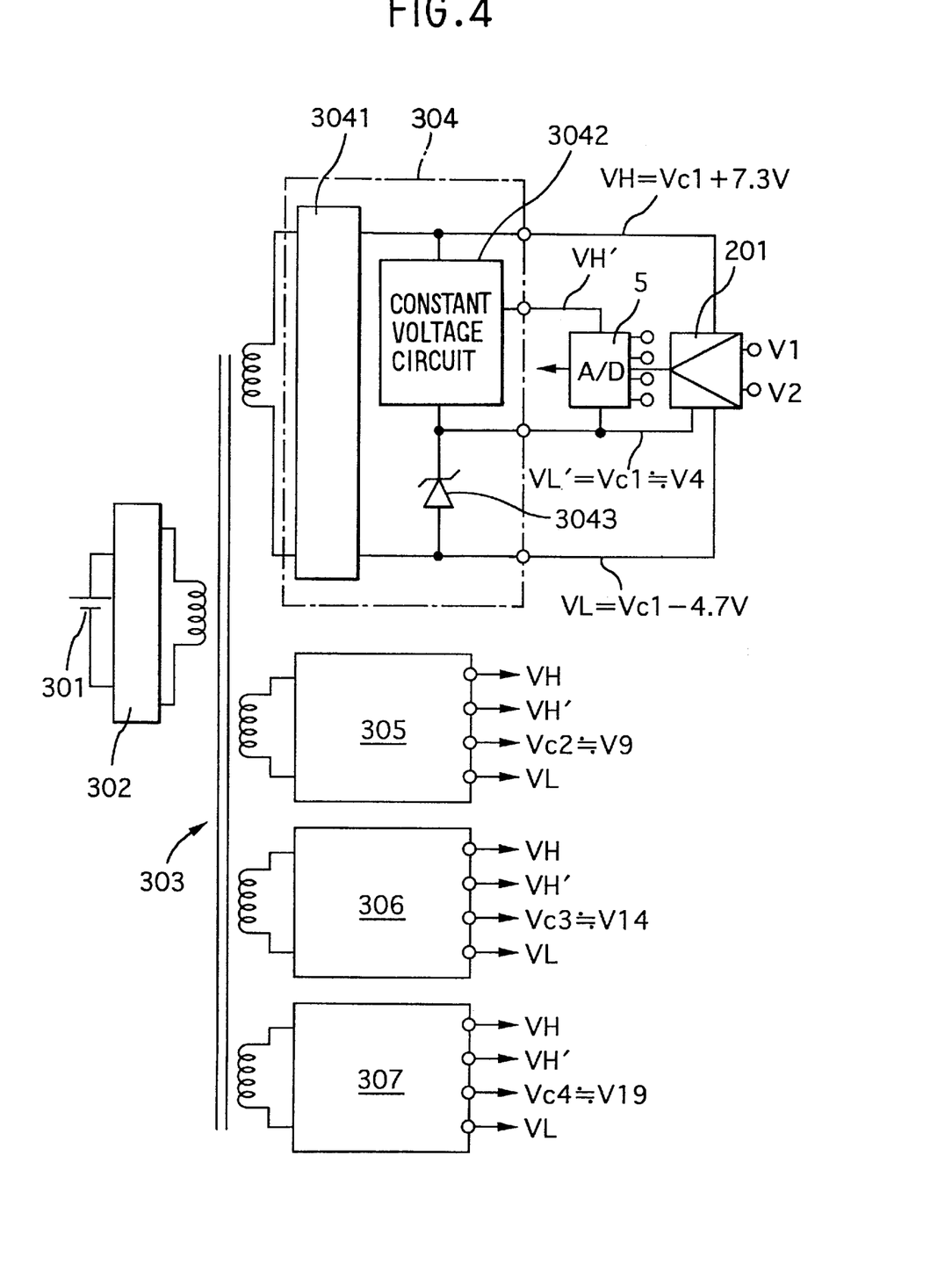
FIG. 4 is a block circuit diagram of a power source circuit for feeding electric power to the A/D convertor 5 and the differential voltage detecting circuit 201.

FIG. 4 shows an example of the power source voltage generating circuit 300 for forming power source voltages (VH, VL) applied on the respective differential voltage detecting circuits 201 through 220 and the A/D convertors 5 through 10.

Numeral 301 designates an auxiliary battery generating a low voltage (12 V) for feeding electric power to auxiliary machinery of an electric vehicle, the DC power thereof is converted into an alternating current power by an oscillating circuit 302 and fed to four power source circuits 304 through 307 for feeding electric power to the voltage detecting blocks via a transformer 303 having four secondary coils.

The four power source circuits 304 through 307 have the same circuit constitution and therefore, an explanation will be given of the power source circuit 304 for feeding power source voltage to the voltage detecting block on the highest potential side.

Alternating current voltage generated by the transformer 303 is converted into direct current voltage by a rectifying and smoothing circuit 3041. The direct current voltage is applied on positive and negative side power source terminals of the differential voltage detecting circuits 201 through 205.

The feature of the power source voltage generating circuit resides in a circuit constitution for generating reference potential Vc1. Specifically explaining, the direct current voltage is applied from the rectifying and smoothing circuit 3041 to a constant voltage circuit 3042 and a Zener diode 3043 connected in series. Further, an output voltage of the constant voltage circuit 3042 is used as a high potential power source voltage VH' of the A/D convertor 5 and a potential at a junction between the constant voltage circuit 3042 and the Zener diode 3043 is used as a low potential power source voltage VL' of the A/D convertor 5. The low potential power source voltage VL' is fed to the differential voltage detecting circuits 201 through 205 as the first reference potential Vc1 ($\approx$V4).

In this way, power source voltages of the two operational amplifiers 2011 and 2012 can be formed by a simple circuit constitution, that is, by only adding one Zener diode 3043 to the constant voltage circuit 3042 for generating the constant power source voltage applied to the A/D convertor 5.

Similar to the power source circuit 304, the power source circuit 305 feeds electric power to the differential voltage detecting circuits 206 through 210 and the A/D convertor 6, the power source circuit 306 feeds electric power to the differential voltage detecting circuits 211 through 215 and the A/D convertor 7, and the power source circuit 307 feeds electric power to the differential voltage detecting circuits 216 through 220 and the A/D convertor 8.

It is to be noted that, although it is illustrated in FIG. 1 such that the first through fourth reference potentials are set by using predetermined module voltages, because the first through fourth reference potentials should be stabilized, it is preferable for the power source circuits 304 through 307 to generate the first through fourth reference potentials as shown in FIG. 4. In this case, it is also preferable that the first through fourth reference potentials are set to an average values of the positive side power source voltages VH and the negative side power source voltages VL in the voltage detecting blocks, respectively. For example, in the voltage detecting block on the highest potential side, the positive side power source voltage VH is set to be higher than the first reference potential Vc1 by a predetermined voltage (e.g., 7.5 V), and the negative side power source voltage VL is set to be lower than the first reference potential Vc1 by the predetermined voltage (7.5 V). As a result, direct current voltage level differences among output voltages from differential voltage detecting circuits can be reduced.

The following operation and effect can be achieved by the power source voltage generating circuit 300 shown in FIG. 4. That is, circuit operating power of the module voltage detecting circuit unit (differential voltage detecting circuits 201 through 220, A/D convertors 5 through 8) is supplied not from the main battery (set battery) 19 but by the auxiliary battery 301.

Therefore, in the voltage detecting device for a set battery, open module voltages can be detected with high accuracy, whereby useless life shortening of the set voltage 19 can be avoided and module voltage can stably be detected regardless of a considerable variation in a power storing state.

In other words, electric charge amounts of the respective battery modules 101 through 120 are not dissipated for detecting the module voltages and therefore, useless life shortening of the set battery 19 can be avoided. Further, discharge current of the battery modules 101 through 120 can be reduced by an amount corresponding to electric power for operating the module voltage detecting circuit unit and therefore, particularly in a case where load current is null or small, accurate open module voltage can be measured. Thereby, the capacity of each of the battery modules can be estimated with high accuracy. It is to be noted that the open module (terminal) voltage has a correlation with the capacity of the module.

Further, even after a vehicle travels for a long distance by which the charge amount of the set battery 19 is considerably reduced, the module voltage detecting circuit units does not undergo influence of lowering of voltage or deficiency in capacity since it is not fed with electric power from the set battery. Accordingly, detection of module voltages can be stably carried out even when the charge amount of the set battery is reduced (at this time, module voltages need to be detected with particular high accuracy).

Furthermore, deterioration of the battery modules is not made nonuniform by a dispersion in power for operating the module voltage detecting circuit units.

It is to be noted that the auxiliary battery 301 supplies signal processing circuits such as the CPU 1 with electric power.

(Second Embodiment)

Next, an explanation will be given of a second embodiment according to the present invention.

First, an explanation will be given of background where a voltage detecting device for a set battery according to the second embodiment has been devised and an outline thereof and thereafter, an explanation will be given of the specific embodiment.

When a total voltage of a set battery is detected from the respective module voltages mentioned above, an error is caused in the total voltage by variations of the respective module voltages in the set battery unless the respective module voltages are simultaneously detected. Further, when a charge stage of each module is estimated by voltage and current of the corresponding module, a considerable error is caused unless voltage and current of each module are simultaneously detected.

Although it is theoretically feasible to simultaneously sample voltage and current of each module by installing detecting circuits for the respective modules, actually, such a circuit constitution is difficult to be realized due to a significant increase in circuit parts and the scale of wiring.

Therefore, it is an object of the second embodiment to provide a voltage detecting device for a set battery which is capable of simultaneously detecting voltage and current of each module while restraining an increase in circuit parts and the scale of wiring.

In the voltage detecting device for a set battery according to the second embodiment, a control circuit causes A/D convertors each converting an analog signal into a digital signal to simultaneously read in analog signals representative of module voltages and sequentially reads out the digital signals from the respective A/D convertors.

That is, by making use of a function of temporarily storing a signal in an A/D convertor, the respective analog signals are simultaneously read in and converted into the digital signals by the A/D convertors, and the converted digital signals are held therein. The digital signals are sequentially read from the respective A/D convertors into the control circuit.

Accordingly, the wiring structure can be simplified since signal paths from the respective A/D convertors to the control circuit are summarized. In addition, the constitution of the control circuit can also be simplified since the control circuit is provided with a common data input port.

In the above-described constitution, the total voltage of the set battery may be detected along with the respective module voltages. In this way, when a sum of the respective module voltages simultaneously detected and the total voltage are significantly deviated from each other, a malfunction such as leakage of current can be determined to occur in any of the respective modules. As a result, the reliability of the circuit is promoted.

It is preferable that the A/D convertor reads the analog signal in synchronism with a clock pulse when a reading instruction is inputted thereto, A/D-converts the read analog signal and thereafter generates, as a serial signal, an output of the digital signal converted from the analog signal responsive to the clock pulse successively received. The control circuit instructs simultaneous reading of the analog signals to the respective A/D convertors and thereafter sequentially transmits the clock pulses to the respective A/D convertors by which the digital signals are sequentially outputted from the respective A/D convertors.

In this way, a simultaneous read-in operation and a time-sequential read-out operation can be realized by using the A/D convertors of a simple synchronously operating serial outputting type without using latching circuits or sampling and holding circuits. As a result, a circuit constitution can be simplified.

Next, a detailed explanation will be given of the second embodiment.

Figure 6:
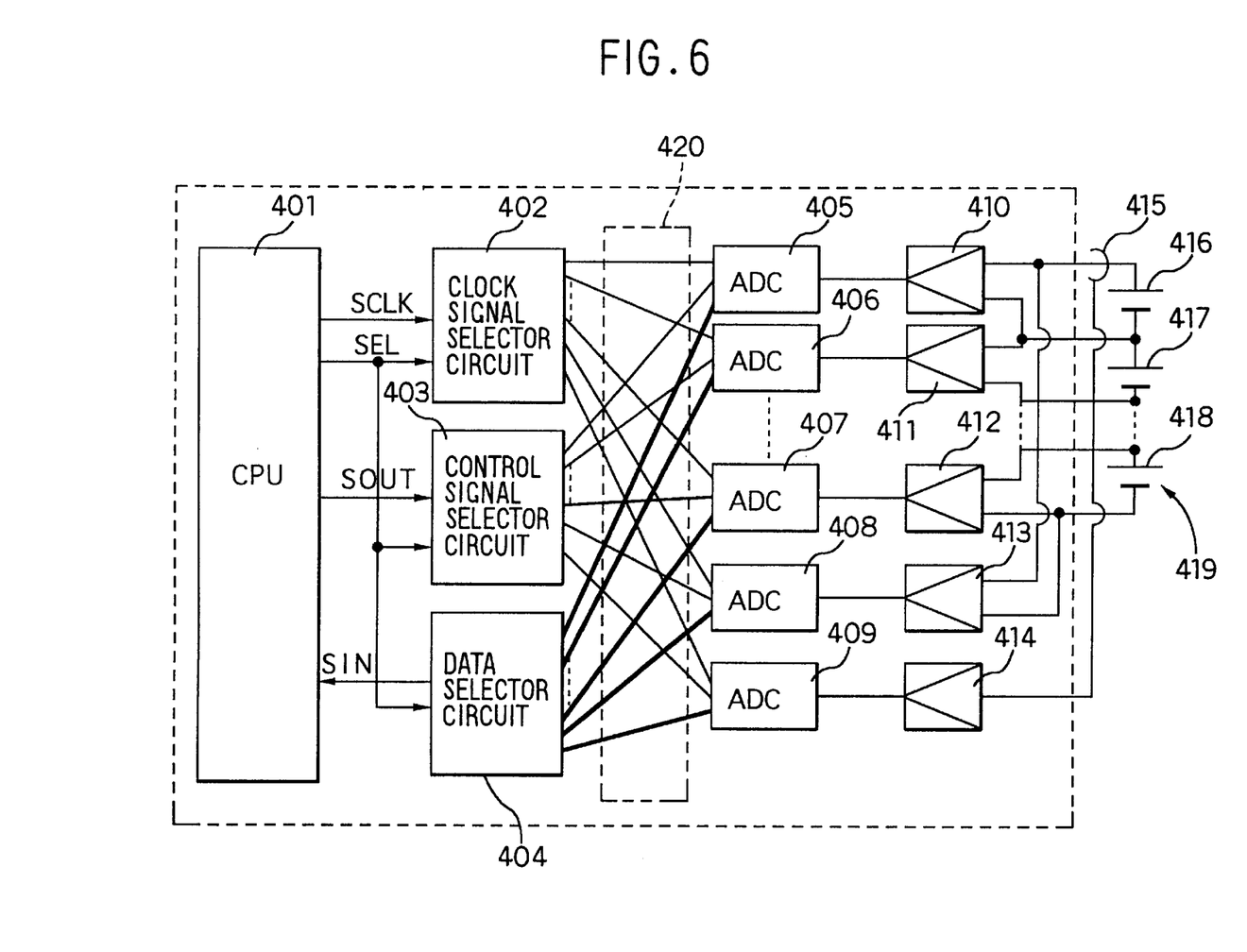
FIG. 6 is a block circuit diagram of a voltage detecting device for a set battery according to a second embodiment.

In FIG. 6, numeral 401 designates a CPU for controlling charge and discharge of batteries, numeral 402 designates a selector circuit comprising a multiplexor for distributing a clock signal (hereinafter, also referred to as a clock signal selector circuit), numeral 403 designates a selector circuit comprising a multiplexor for distributing a control signal (hereinafter, also referred to as a control signal selector circuit) and numeral 404 designates a selector circuit comprising a multiplexor for selecting digital signals (hereinafter, also referred to as a data selector circuit). Further, numerals 405 through 409 designate A/D convertors, numerals 410 through 413 designate differential amplifying circuits, numeral 414 designates an analog amplifying circuit, numeral 415 designates a current sensor, numerals 416 through 418 designate respective battery modules of a set battery 319. Each of the modules 416 through 418 is constituted by connecting several tens of cell batteries in series. Numeral 420 designates a group of serial signal lines for connecting the respective selector circuits 402 through 404 with the respective A/D convertors 405 through 409.

According to the second embodiment, the respective signal lines are provided with photo couplers (not illustrated) for protecting the CPU 401 by cutting high voltage.

As shown in FIG. 6, a module voltage (analog signal) of the module 416 is converted into a voltage signal relative to a predetermined common ground potential by the differential amplifying circuit 410 and thereafter, A/D-converted by the A/D convertor 405. Similarly, module voltages (analog signals) of the modules 417 and 418 are converted into voltage signals relative to the predetermined common ground potential by the differential amplifying circuits 411 and 412 and thereafter, A/D-converted by the A/D convertors 406 and 407. Further, a total voltage (analog signal) of the set battery 419 is converted into a voltage signal relative to the predetermined common ground potential by the differential amplifying circuit 413 and thereafter, A/D-converted by the A/D convertor 408. Current of the set battery 419 is converted into a voltage signal by the amplifying circuit 414 and thereafter, A/D-converted by the A/D convertor 409.

Outputs of the respective A/D convertors 405 through 409 are sequentially selected by the data selector circuit 404 and read in by the CPU 401 as signals SIN.

The A/D convertors 405 through 409 are of a synchronously operating serial outputting type. That is, converted data, i.e., serial data signals are outputted in synchronism with an inputted clock pulse after the digital signals are established.

Figure 7:
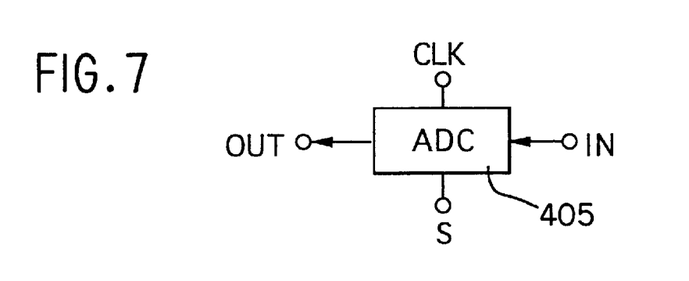
FIG. 7 is a block diagram of an A/D convertor in FIG. 6.

That is, as shown in FIG. 7, the A/D convertor 405 is provided with an analog input terminal IN to which an analog signal is inputted, a data outputting terminal OUT for outputting a digital signal which is a serial signal, a control command input terminal S to which a control command of a serial signal is inputted and a clock pulse input terminal CLK to which clock pulses for synchronization are inputted. When a read instruction is inputted to the control command input terminal S, the analog signal is read in synchronism with an edge of the clock pulse inputted to the clock pulse input terminal CLK. Thereafter, 8 bits of a serial digital signal are outputted responsive to a clock pulse successively inputted. The other A/D convertors 406 through 408 are provided with the same structure.

An explanation will be given of further detailed operation of the voltage detecting device for the set battery.

The CPU 401 outputs clock pulses SCLK and an A/D convertor selecting signal SEL to the clock signal selector circuit 402. Further, the CPU 401 outputs a control command signal SOUT such as a read instruction or the like and the A/D convertor selecting signal SEL to the control signal selector circuit 403. Also, the CPU 401 outputs the A/D convertor selecting signal SEL to the data selector circuit 404. The CPU 401 receives serial digital signals from the data selector circuit 404.

The CPU 401 informs the clock signal selector circuit 402 and the control signal selector circuit 403 that all of the A/D convertors 405 through 409 are selected by the A/D convertor selecting signal SEL. Thereby, the control signal selector circuit 403 transmits the read instruction to all of the A/D convertors 405 through 409, and the clock signal selector circuit 402 transmits the clock pulses SCLK to all of the A/D convertors 405 through 409. As a result, the respective A/D convertors 405 through 409 read the analog signals in synchronism with the edges of the clock pulses which are inputted immediately after the read instruction is inputted, convert them into digital signals of 8 bits and hold the digital signals. Further, at this occasion, in respect of the data selector circuit 404, the A/D convertor selecting signal SEL for selecting all of the A/D convertors 405 through 409 is made ineffective at inside of the data selector circuit 404.

Next, the CPU 401 informs the selector circuits 402 through 404 that the A/D convertor 405 is selected by the A/D convertor selecting signal SEL. Thereby, the clock signal selector circuit 402 transmits the clock pulses SCLK only to the A/D convertor 405. Thereby, the A/D convertor 405 outputs a serial digital signal to the data selector circuit 404 in synchronism with an edge of the clock pulses SCLK. That data selector circuit 404 selects the A/D convertor 405 by the A/D convertor selecting signal SEL and therefore, the serial data signal from the A/D convertor 405 is transmitted to the CPU 401 via the data selector circuit 404.

Next, the CPU 401 informs the selector circuits 402 through 404 that the A/D convertor 406 is selected by the A/D convertor selecting signal SEL. Thereafter, the same operation described above is carried out, the serial digital signal from the A/D convertor 406 is transmitted to the CPU 401. In the following, similarly, serial digital signals of the respective A/D convertors 407 through 409 are transmitted to the CPU 401.

As mentioned above, according to the voltage detecting device for the set battery of the second embodiment, a simultaneous read-in operation and a time-sequential read-out operation for the respective module voltages, the total voltage, and the current are carried out by making use of the function of temporarily holding the digital data signal in the A/D convertors 405 through 409. Accordingly, extra circuits such as latching circuits or sampling and holding circuits need not to be used.

As a result, the capacity of each of the battery modules can accurately be estimated in consideration of the internal resistance of the corresponding module based on the module voltage and current thereof simultaneously read in. Further, failure of the set battery or the like can easily be determined based on a sum of the respective module voltages and the total voltage by simultaneously reading in the respective module voltages and the total voltage.

In the second embodiment, although the A/D convertors 405 through 409 each having a single channel are used, the A/D convertors 405 to 407 among them may be replaced with a single input-switching type A/D convertor having multi channels. In this case, as described in the first embodiment, the input signals to the A/D convertor are sequentially switched from the signal of the differential amplifier circuit 310 to the signal of the differential amplifier circuit 312.

Further, the group of serial signal lines adopted in the first and the second embodiments can be replaced by parallel signal lines.

What is claimed is:

1. A voltage detecting device for a set battery which comprises a plurality of battery modules connected to each other in series, said voltage detecting device comprising:
    a plurality of differential voltage detecting circuits for detecting module voltages of said battery modules, respectively;
    an A/D convertor for A/D converting output voltages of said differential voltage detecting circuits; and
    reference voltage providing circuits for providing reference voltages to said differential voltage detecting circuits,
    wherein said differential voltage detecting circuits are grouped into several voltage detecting blocks so that differential voltage detecting circuits for respectively detecting module voltages of said battery modules contiguous to each other constitute one of said voltage detecting blocks, a common reference voltage is provided to said differential voltage detecting circuits belonging to a same voltage detecting block by said reference voltage providing circuit, and said reference potentials are set to values which differ from each other for said respective voltage detecting blocks.

2. A voltage detecting device according to claim 1, wherein said A/D convertor has a plurality of A/D convertor circuits each of which is assigned to each of said voltage detecting blocks, and each of said A/D convertor circuits sequentially A/D-converts said output voltages of said differential voltage detecting circuits belonging to a same voltage detecting block.

3. A voltage detecting device according to claim 2, further comprising:
    photo couplers for transmitting output signals of said A/D convertor circuits to a digital signal processing circuit operated with a predetermined low power source voltage.

4. A voltage detecting device according to claim 1, wherein each of said voltage detecting blocks includes at least three differential voltage detecting circuits for respectively detecting module voltages of at least three battery modules contiguous to each other, and each of said reference voltages is set to an intermediate potential which is lower than the highest potential among said battery modules and is higher than the lowest potential among said battery modules.

5. A voltage detecting device according to claim 4, wherein said reference voltage providing circuits generate each of said reference voltages from a terminal voltage of a battery module which is most close to a middle potential between said highest and lowest potentials among said battery modules corresponding to said differential voltage detecting circuits belonging to a same voltage detecting block.

6. A voltage detecting device according to claim 1, wherein each of said differential voltage detecting circuits detects a module voltage by deriving a first difference between a high potential side voltage of a corresponding battery module and said reference voltage, deriving a second difference between a low potential side voltage thereof and said reference voltage, and subtracting said second difference from said first difference.

7. A voltage detecting device according to claim 6, wherein said A/D convertor has a plurality of A/D convertor circuits each of which is assigned to each of said voltage detecting blocks, and each of said A/D convertor circuits sequentially A/D-converts said output voltages of said differential voltage detecting circuits belonging to a same voltage detecting block.

8. A voltage detecting device according to claim 7, further comprising:
    photo couplers for transmitting output signals of said A/D convertor circuits to a digital signal processing circuit operated with a predetermined low power source voltage.

9. A voltage detecting device according to claim 6, wherein each of said voltage detecting blocks includes at least three differential voltage detecting circuits for respectively detecting module voltages of at least three battery modules contiguous to each other, and each of said reference voltages is set to an intermediate potential which is lower than the highest potential among said battery modules and is higher than the lowest potential among said battery modules.

10. A voltage detecting device according to claim 9, wherein said reference voltage providing circuits generate each of said reference voltages from a terminal voltage of a battery module which is most close to a middle potential between said highest and lowest potentials among said battery modules corresponding to said differential voltage detecting circuits belonging to a same voltage detecting block.

11. A voltage detecting device for a set battery which comprises a plurality of battery modules connected to each other in series, said voltage detecting device comprising:
a plurality of differential voltage detecting circuits for detecting module voltages of said battery modules, respectively;
reference voltage providing circuits for providing reference voltages to said differential voltage detecting circuits;
wherein said differential voltage detecting circuits are grouped into several voltage detecting blocks so that differential voltage detecting circuits for respectively detecting module voltages of said battery modules contiguous to each other constitute one of said voltage detecting blocks, a common reference voltage is provided to said differential voltage detecting circuits belonging to a same voltage detecting block by said reference voltage providing circuit, and said reference potentials are set to values which differ from each other for said respective voltage detecting blocks;
a plurality of voltage A/D convertors for individually A/D-converting module voltages of said battery modules;
a current A/D convertor for A/D-converting set battery current; and a control circuit which causes said voltage A/D convertors and said current A/D convertor to simultaneously read in analog signals representative of said module voltages and said set battery current and which sequentially reads out digital signals from the respective A/D convertors.

12. A voltage detecting device according to claim 11, wherein said control circuit estimates a capacity of each of said battery modules based on said module voltages and said set battery current simultaneously detected.

13. A voltage detecting device according to claim 11, further comprising:
a total voltage A/D convertor for A/D-converting a total voltage of said set battery,
said control circuit simultaneously detects said total voltage of said set battery and said respective module voltages.

14. A voltage detecting device according to claim 13, wherein said control circuit compares said total voltage with a sum of said module voltages to determine an occurrence of failure in said set battery.

15. A voltage detecting device according to claim 11, wherein each of said A/D convertors reads in said analog signal in synchronism with a clock pulse when a reading instruction is inputted thereto, A/D-converts said analog signal into said digital signal and thereafter generates, as a serial signal, an output of said digital signal responsive to a clock pulse successively inputted thereto, and said control circuit instructs simultaneous reading of the analog signals to said A/D convertors and thereafter sequentially sends out said clock pulses to said A/D convertors by which said digital signals are sequentially outputted from said A/D convertors.

16. A voltage detecting device for a set battery which comprises a plurality of battery modules connected to each other in series, said voltage detecting device comprising:
a plurality of differential voltage detecting circuits for respectively detecting module voltage of each battery module, said differential voltage detecting circuits are grouped into several voltage detecting blocks;
a plurality of reference voltage equalizing circuits each of which providing a common reference voltage to said differential voltage detecting circuits belonging to a same voltage detecting block; and
a reference voltage changing circuit for making said common reference voltage of each reference voltage equalizing circuit different from that of the other reference voltage equalizing circuit for the other voltage detecting block.

17. A voltage detecting device according to claim 16, further comprising an A/D convertor for A/D converting output voltages of said differential voltage detecting circuits, wherein said A/D convertor has a plurality of A/D convertor circuits each of which is assigned to each of said voltage detecting blocks, and each of said A/D convertor circuits sequentially A/D-converts said output voltages of said differential voltage detecting circuits belonging to a same voltage detecting block.

18. A voltage detecting device according to claim 17, further comprising:
photo couplers for transmitting output signals of said A/D convertor circuits to a digital signal processing circuit operated with a predetermined low power source voltage.

19. A voltage detecting device according to claim 16, wherein each of said voltage detecting blocks includes at least three differential voltage detecting circuits for respectively detecting module voltages of at least three battery modules contiguous to each other, and each of said reference voltages is set to an intermediate potential which is lower than the highest potential among said battery modules and is higher than the lowest potential among said battery modules.

20. A voltage detecting device according to claim 19, wherein said reference voltage equalizing circuits generate each of said reference voltages from a terminal voltage of a battery module which is most close to a middle potential between said highest and lowest potentials among said battery modules corresponding to said differential voltage detecting circuits belonging to a same voltage detecting block.

21. A voltage detecting device according to claim 16, wherein each of said differential voltage detecting circuits detects a module voltage by deriving a first difference between a high potential side voltage of a corresponding battery module and said reference voltage, deriving a second difference between a low potential side voltage thereof and said reference voltage, and subtracting said second difference from said first difference.

22. A voltage detecting device according to claim 21, further comprising an AID convertor for A/D converting output voltages of said differential voltage detecting circuits, wherein said A/D convertor has a plurality of A/D convertor circuits each of which is assigned to each of said voltage detecting blocks, and each of said A/D convertor circuits sequentially A/D-converts said output voltages of said differential voltage detecting circuits belonging to a same voltage detecting block.

23. A voltage detecting device according to claim 22, further comprising: photo couplers for transmitting output signals of said A/D convertor circuits to a digital signal processing circuit operated with a predetermined low power source voltage.

24. A voltage detecting device according to claim 21, wherein each of said voltage detecting blocks includes at least three differential voltage detecting circuits for respectively detecting module voltages of at least three battery modules contiguous to each other, and each of said reference voltages is set to an intermediate potential which is lower than the highest potential among said battery modules and is higher than the lowest potential among said battery modules.

25. A voltage detecting device according to claim 24, wherein said reference voltage equalizing circuits generate each of said reference voltages from a terminal voltage of a battery module which is most close to a middle potential between said highest and lowest potentials among said battery modules corresponding to said differential voltage detecting circuits belonging to a same voltage detecting block.

* * * * *